United States Patent [19]
Greim

[11] Patent Number: 6,133,737
[45] Date of Patent: Oct. 17, 2000

[54] CIRCULARLY POLARIZING ANTENNA FOR A MAGNETIC RESONANCE APPARATUS

[75] Inventor: Helmut Greim, Adelsdorf, Germany

[73] Assignee: Siemens Aktiengesellschaft, Munich, Germany

[21] Appl. No.: 09/080,355

[22] Filed: May 18, 1998

[30] Foreign Application Priority Data

May 26, 1997 [DE] Germany .................... 197 21 986

[51] Int. Cl.[7] .................................................. G01V 3/00
[52] U.S. Cl. .................................... 324/318; 324/322
[58] Field of Search .................................. 324/318, 307, 324/309, 319, 322; 333/219, 227, 230, 299; 600/422; 343/850, 750, 909

[56] References Cited

U.S. PATENT DOCUMENTS

| | | | |
|---|---|---|---|
| 4,594,566 | 6/1986 | Maudsley | 333/219 |
| 4,757,290 | 7/1988 | Keren | 333/219 |
| 4,825,163 | 4/1989 | Yabusaki et al. | 324/318 |

*Primary Examiner*—Jay Patidar
*Assistant Examiner*—Dixomara Vargas
*Attorney, Agent, or Firm*—Hill & Simpson

[57] ABSTRACT

A circularly polarizing antenna for a magnetic resonance apparatus is formed by a first linear antenna subsystem and a second antenna subsystem arranged so as to be rotated 90° relative to each other. On the side of the signal terminals and each antenna subsystem has a self-contained conductor. On the side facing away from the signal terminals, the antenna subsystems have a common self-contained conductor.

7 Claims, 1 Drawing Sheet

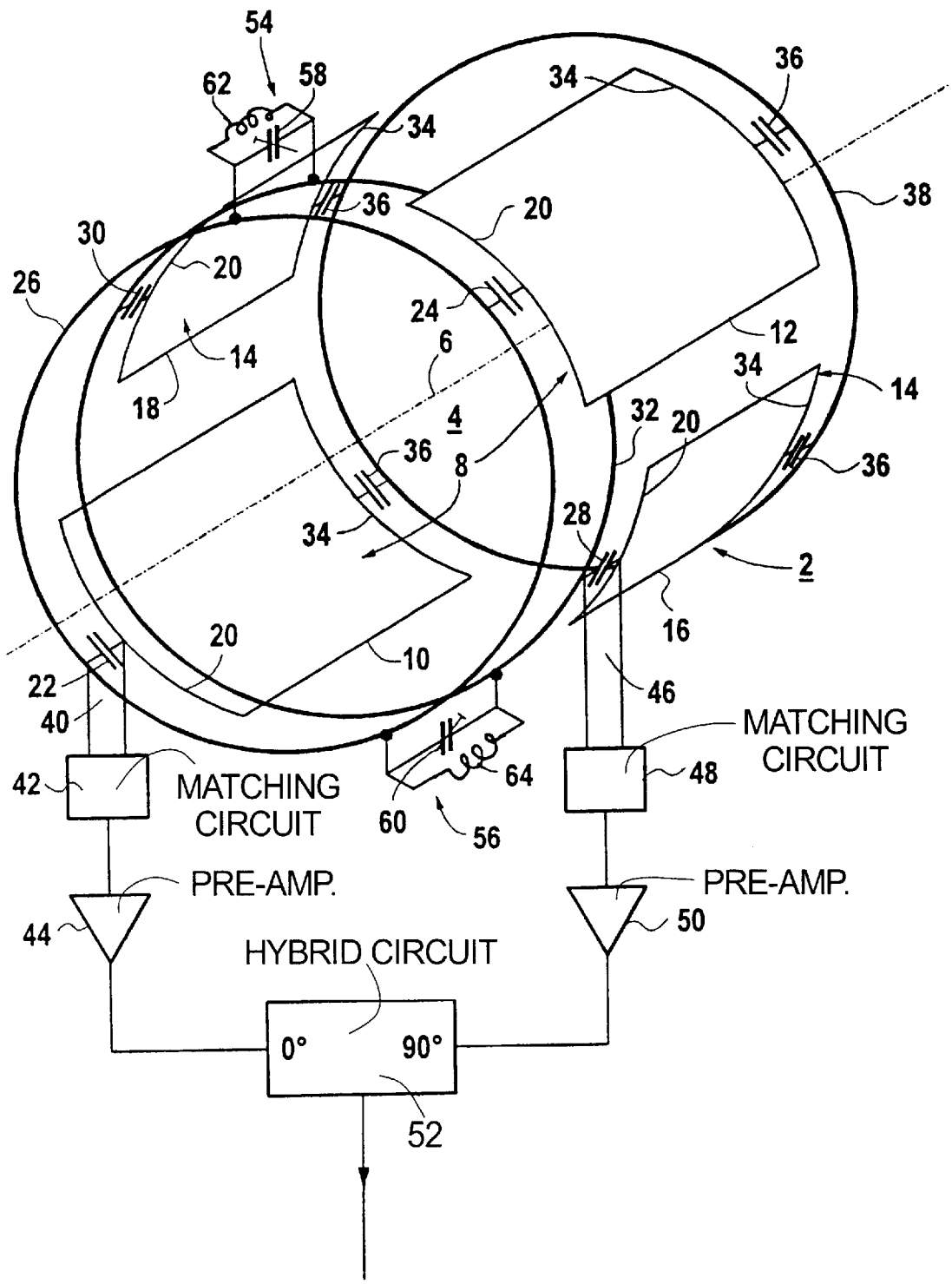

CIRCULARLY POLARIZING ANTENNA FOR A MAGNETIC RESONANCE APPARATUS

BACKGROUND OF THE INVENTION

1. Field of the Invention

The present invention is directed to a circularly polarizing antenna for a magnetic resonance apparatus of the type having a first linear antenna subsystem with first and second longitudinal conductors, arranged opposite one another with an identical lateral spacing parallel to an axis, and a first signal terminal, and having a second linear antenna subsystem with third and fourth longitudinal conductors that are arranged opposite one another with the aforementioned lateral spacing parallel to the axis, and a second signal terminal, with the first and second antenna subsystems being arranged rotated by 90° relative to one another around the axis.

2. Description of the Prior Art

A circularly polarizing antenna of the type described above is known from U.S. Pat. No. 4,825,163. This antenna is of a type described known as a volume antenna, and encloses a cylindrical imaging volume. It is particularly suitable for the examination of the extremities or of the head, whereby the examination region fills the imaging volume of the antenna as much as possible, in order to achieve a high signal-to-noise ratio.

This known antenna, however, cannot be operated simultaneously with other reception antennas (array operation), because artefacts and a worsening of the signal-to-noise ratio can then occur as a result of undesirable couplings of the antennas with one another.

SUMMARY OF THE INVENTION

An object of the present invention is to provide a symmetrically constructed, circularly polarizing volume antenna which can be decoupled from adjacent antennas that are operated at the same time.

The object is achieved in an antenna of the type initially described wherein a first end of the first longitudinal conductor is connected via a first capacitance to a first self-contained conductor that encloses the axis, with the first signal terminal being electrically connected across the first capacitance. The first end of the second longitudinal conductor is also connected, via a second capacitance, to the first self-conductor. First ends of the third and fourth longitudinal conductors are respectively connected, via a third and fourth capacitances, to a second self-contained conductor that surrounds the axis, with the second signal terminal being connected electrically parallel to the third capacitance. The second ends of all the longitudinal conductors are connected with a third independent conductor that surrounds the axis.

As used herein, "self-contained" means a closed (continuous) conductor that is independent of any of the longitudinal conducts.

Thus, each linear antenna subsystem has a separate closed conductor on the side of the signal terminal. A known preamplifier decoupling can thus be used for the decoupling of adjacent antennas, in which decoupling an input impedance of a connected preamplifier is selected so that, together with a matching circuit, it represents a parallel resonance point at the signal terminal. The decoupling to adjacent antennas is thereby separated from the field symmetrization within the circularly polarizing antennas. A closed conductor, common to both antenna subsystems, on the side of the signal terminals (as in the prior art) would result, given a preamplifier decoupling, in a shift of the symmetries within the antenna, and thus the intrinsic decoupling of the two linear antenna subsystems would be disturbed.

In an embodiment of the circularly polarizing antenna, the second ends of the longitudinal conductors are respectively connected with the third conductor via a further capacitor arrangement. The current distribution to the longitudinal conductors is thereby made symmetrical.

In a further embodiment, the longitudinal conductors are fashioned as strip conductors, in order to homogenize the sensitivity distribution in the imaging volume.

In another embodiment the first and second conductors are connected with one another via at least one reactance network. Remaining couplings can thereby be neutralized by means of parasitic effects and asymmetries between the two linear antenna subsystems.

DESCRIPTION OF THE DRAWINGS

The single FIGURE is a schematic, perspective view of an exemplary embodiment of a circularly polarizing antenna for a magnetic resonance apparatus, constructed in accordance with the principles of the present invention.

DESCRIPTION OF THE PREFERRED EMBODIMENTS

The FIGURE shows, in a perspective view, a circularly polarizing antenna 2, which is fashioned as a volume antenna for a diagnostic magnetic resonance apparatus. The antenna 2 has a cylindrical construction and completely encloses a body part to be examined (e.g. head or extremities). The volume antenna 2 is dimensioned so that the interior space 4 enclosed by the antenna as the imaging volume has a sensitivity that is as homogenous as possible for the magnetic resonance signals radiated by the body part to be examined. The antenna 2 is constructed so as to be largely symmetrical to an axis 6. The antenna 2 has a first linear antenna subsystem 8 formed by a first longitudinal conductor 10 and a second longitudinal conductor 12. The first longitudinal conductor 10 and the second longitudinal conductor 12 are arranged so as to be opposite one another, with an identical lateral spacing parallel to the axis 6. A second linear antenna subsystem 14 is arranged rotated by 90° around the axis 6 in relation to the first linear antenna subsystem 8. The second linear antenna subsystem 14 is formed by a third longitudinal conductor 16 and a fourth longitudinal conductor 18 that are arranged opposite one another, with the same lateral spacing as the first and second longitudinal conductors 10 and 12, parallel to the axis 6. First ends (in the FIGURE, the front ends 20 of the first and second longitudinal conductors 10, 12) are connected respectively via a first capacitance 22 and a second capacitance 24 to a first self-contained annular conductor 26, which encloses the axis 6. The midpoint of the first annular closed conductor 26 lies on the axis 6. First ends 20 of the third and fourth longitudinal conductors 16, 18 are connected respectively via a third capacitance 28 and a fourth capacitance 30 to a second self-contained annular conductor 32. The midpoint of the second annular conductor 32 likewise lies on the axis 6. Second ends 34 of the four longitudinal conductors 10, 12, 16, 18 (in the FIGURE, the second ends 34 are the back ends of the longitudinal conductors) are electrically connected, via capacitors of a further capacitance 36, to a third self-contained annular conductor 38.

The longitudinal conductors 10, 12, 16, 18 are fashioned as strip conductors in order to realize an optimal degree of coverage in the circumferential direction, so as to obtain a sensitivity distribution that is as homogenous as possible.

The first linear antenna subsystem 8 has a signal terminal 40 that is connected electrically parallel to the first capacitance 22, and that is connected, via a matching network 42, with the input of a first preamplifier 44. The input impedance of the first preamplifier 44 is dimensioned so that, together with the matching circuit 42 at the signal terminal 40, it forms a parallel resonance point for the frequency of the received magnetic resonance signals.

The antenna 2 has a second signal terminal 46, which supplies the magnetic resonance signals received from the second linear antenna subsystem 14 to a second preamplifier 40 via a second matching circuit 48. The input impedance of the second preamplifier 50 is also dimensioned so that, with the second matching circuit 48 at the second signal terminal 46, it forms a parallel resonance point.

The outputs of the two preamplifiers 44 and 50 are connected with a hybrid 52 that delays the signal supplied by the second preamplifier 50 by 90° in relation to the signal supplied by the first preamplifier 44, and then combines the two signals.

For the neutralization of parasitic effects and asymmetries, the first and second closed conductors 26 and 32 are connected with one another via two reactance networks 54 and 56. The reactance network 54 is formed by a parallel circuit of an adjustable capacitor 58 and an inductance 62, and the reactance network 56 is formed of a parallel circuit of an adjustable capacitor 60 and an inductance 64.

Although modifications and changes may be suggested by those skilled in the art, it is the intention of the inventor to embody within the patent warranted hereon all changes and modifications as reasonably and properly come within the scope of his contribution to the art.

I claim as my invention:

1. A circularly polarizing antenna for a magnetic resonance apparatus, comprising:

a first linear antenna subsystem comprising a first longitudinal conductor and a second longitudinal conductor disposed opposite each other with identical respective lateral spacing parallel to an axis, said first linear antenna subsystem having a first signal terminal and said first and second longitudinal conductors each having a first end and each having a second end;

a second linear antenna subsystem comprising a third longitudinal conductor and fourth longitudinal conductor disposed opposite each other with said identical lateral spacing parallel to said axis, said second linear antenna subsystem having a second signal terminal and said third and fourth longitudinal conductors each having a first end and a second end;

said first and second antenna subsystems being rotated by 90° relative to each other around said axis;

a first self-contained conductor surrounding said axis;

said first end of said first longitudinal conductor being connected to said first self-contained conductor via a first capacitance and said first end of said second longitudinal conductor being connected to said first self-contained conductor via a second capacitance;

said first signal terminal being connected across said first capacitance;

a second self-contained conductor surrounding said axis;

said third longitudinal conductor being connected to said second self-contained conductor via a third capacitance and said fourth longitudinal conductor being connected to said second self-contained conductor via a fourth capacitance;

said second signal terminal being connected across said third capacitance; and a third self-contained conductor surrounding said axis and connected to the respective second ends of each of said first, second, third and fourth longitudinal conductors.

2. A circularly polarizing antenna as claimed in claim 1 wherein the respective second ends of said first, second, third and fourth longitudinal conductors are connected to said third self-contained conductor via a third capacitance.

3. A circularly polarizing antenna as claimed in claim 1 wherein each of said first, second, third and fourth longitudinal conductor comprises a strip conductor.

4. A circularly polarizing antenna as claimed in claim 3 wherein each of said strip conductors is disposed on a lateral cylindrical surface of a cylinder having a cylinder axis coinciding with said axis.

5. A circularly polarizing antenna as claimed in claim 1 wherein each of said first, second and third self-contained conductor comprises a circular conductor having a center disposed on said axis.

6. A circularly polarizing antenna as claimed in claim 1 wherein said first self-contained conductor and said second self-contained conductor are connected together via at least one reactance network.

7. A circularly polarizing antenna as claimed in claim 1 further comprising:

a first matching circuit having inputs connected to said first signal terminal and having an output;

a first preamplifier having an input impedance connected to said output of said first matching circuit, said first matching circuit and said input impedance of said first preamplifier forming a parallel resonant circuit at said first signal terminal;

a second matching circuit having inputs connected to said second signal terminal and having an output; and a second preamplifier having an input impedance connected to said output of said second matching circuit, said second matching circuit and said input impedance of said second preamplifier forming a parallel resonant circuit at said second signal terminal.

* * * * *